(12) United States Patent
Staton et al.

(10) Patent No.: US 8,990,038 B2
(45) Date of Patent: Mar. 24, 2015

(54) METHOD AND APPARATUS FOR MONITORING BATTERY LIFE

(76) Inventors: Kenneth L. Staton, San Carlos, CA (US); Michael Andrew Cretella, San Francisco, CA (US); John Depew, Sunnyvale, CA (US); Wing Kong Low, Sunnyvale, CA (US)

(*) Notice: Subject to any disclaimer, the term of this patent is extended or adjusted under 35 U.S.C. 154(b) by 268 days.

(21) Appl. No.: 13/107,923

(22) Filed: May 15, 2011

(65) Prior Publication Data

US 2011/0313697 A1 Dec. 22, 2011

Related U.S. Application Data

(60) Provisional application No. 61/355,405, filed on Jun. 16, 2010.

(51) Int. Cl.
 G01R 31/36 (2006.01)
 G06F 19/00 (2011.01)

(52) U.S. Cl.
 CPC ........ G01R 31/3679 (2013.01); *G01R 31/3651* (2013.01)
 USPC .............. 702/63; 320/149; 324/427; 324/433

(58) Field of Classification Search
 CPC ............... G01R 31/36; G01R 31/3679; G01R 31/3651; G06F 19/00; G06F 1/00; G09G 5/08; H01M 10/44; G01N 27/416
 USPC ...................... 702/63; 324/427, 433; 320/149
 See application file for complete search history.

(56) References Cited

U.S. PATENT DOCUMENTS

| 6,215,275 | B1 | 4/2001 | Bean |
| 6,400,123 | B1 | 6/2002 | Bean et al. |
| 6,404,164 | B1 * | 6/2002 | Bean et al. .................... 320/106 |
| 7,259,538 | B2 * | 8/2007 | Melton et al. ................. 320/106 |
| 7,702,369 | B1 * | 4/2010 | Wright .......................... 455/571 |
| 7,715,794 | B2 * | 5/2010 | Hulvey ........................ 455/41.2 |
| 7,900,070 | B2 * | 3/2011 | Wu et al. ....................... 713/320 |
| 8,410,783 | B2 * | 4/2013 | Staton .......................... 324/433 |
| 2005/0062455 | A1 | 3/2005 | Stavely et al. |
| 2007/0229460 | A1 * | 10/2007 | Yamazaki et al. ............ 345/163 |
| 2008/0312852 | A1 | 12/2008 | Maack |
| 2011/0119005 | A1 * | 5/2011 | Majima et al. ................. 702/63 |
| 2012/0109248 | A1 * | 5/2012 | Danielsson et al. ............ 607/29 |

FOREIGN PATENT DOCUMENTS

GB  2445799 A  6/2009

* cited by examiner

*Primary Examiner* — Eliseo Ramos Feliciano
*Assistant Examiner* — Ruihua Zhang
(74) *Attorney, Agent, or Firm* — Womble Carlyle Sandridge & Rice, LLP

(57) ABSTRACT

A method and apparatus for monitoring battery life in a human input device powered by replaceable batteries includes repeatedly measuring battery charge by use of a measuring arrangement forming part of the input device. Battery charge is measured while the input device is in a relatively inactive condition and when it is in an active condition, and a time value is associated with each battery charge measurement. A usage model may be constructed based on the battery charge measurements, and calculation of an expected battery life may be based at least in part on the usage model.

25 Claims, 7 Drawing Sheets

METHOD AND APPARATUS FOR MONITORING BATTERY LIFE

CLAIM OF PRIORITY

This application claims the benefit of priority under 35 U.S.C. §119 (e) to U.S. Provisional Application Ser. No. 61/355,405 filed Jun. 16, 2010, the disclosure of which is incorporated by reference herein in its entirety.

BACKGROUND

The present invention relates generally to methods and apparatus for monitoring battery life in a human input device to a processing system, such as a computer; and more specifically relates to improved methods and apparatus for measuring battery charge levels and calculating expected life of input device batteries.

Wireless human input devices, such as a wireless mouse, keyboard, microphone, trackball, or the like are typically powered by removable and replaceable batteries having a standardized shape and/or dimensions, but having any one of a plurality of chemistries and other characteristics. Accurate assessment of the expected life of batteries in such devices is problematic.

SUMMARY OF THE INVENTION

The present invention utilizes a measuring arrangement on an input device to repeatedly measure a battery charge of non-specific type batteries that are in the device, and to calculate an expected battery life based on the battery charge measurements. A time value may be associated with each battery charge measurement, and in some examples, the method will include determining a rate of change in battery charge based on a series of battery charge measurements and associated time values.

Battery charge measurements may be made by the measuring arrangement on the input device both while the device is an active condition and when the device is in a relatively inactive condition. A usage model may further be constructed based on the battery charge measurements, and thus the usage model can be based on the actual use of the input device in question. In some examples, the calculation of the expected battery life will be based at least in part on the usage model.

DETAILED DESCRIPTION

The following detailed description refers to the accompanying drawings that depict various details of examples selected to show how the present invention may be practiced. The discussion addresses various examples of the inventive subject matter at least partially in reference to these drawings, and describes the depicted embodiments in sufficient detail to enable those skilled in the art to practice the invention. Many other embodiments may be utilized for practicing the inventive subject matter other than the illustrative examples discussed herein, and may structural and operational changes in addition to the alternatives specifically discussed herein may be made without departing from the scope of the inventive subject matter.

In this description, references to "one embodiment" or "an embodiment," or to "one example" or "an example" in this description are not intended necessarily to refer to the same embodiment or example; however, neither are such embodiments mutually exclusive, unless so stated or as will be readily apparent to those of ordinary skill in the art having the benefit of this disclosure. Thus, the present invention can include a variety of combinations and/or integrations of the embodiments and examples described herein, as well as further embodiments and examples as defined within the scope of all claims based on this disclosure, as well as all legal equivalents of such claims.

For the purposes of this specification, a "processor-based system" or "processing system" includes a system using one or more processors, microcontrollers and/or digital signal processors or other devices having the capability of running a "program," (all such devices being referred to herein as a "processor"). A "program" is any set of executable machine code instructions, and as used herein, includes user-level applications as well as system-directed applications or daemons. Examples of processing systems include communication and electronic devices such as cell phones, music and multimedia players, and Personal Digital Assistants (PDA); as well as computers, or "computing devices" of all forms (desktops, laptops, servers, tablets, palmtops, workstations, etc.).

Figure 1:
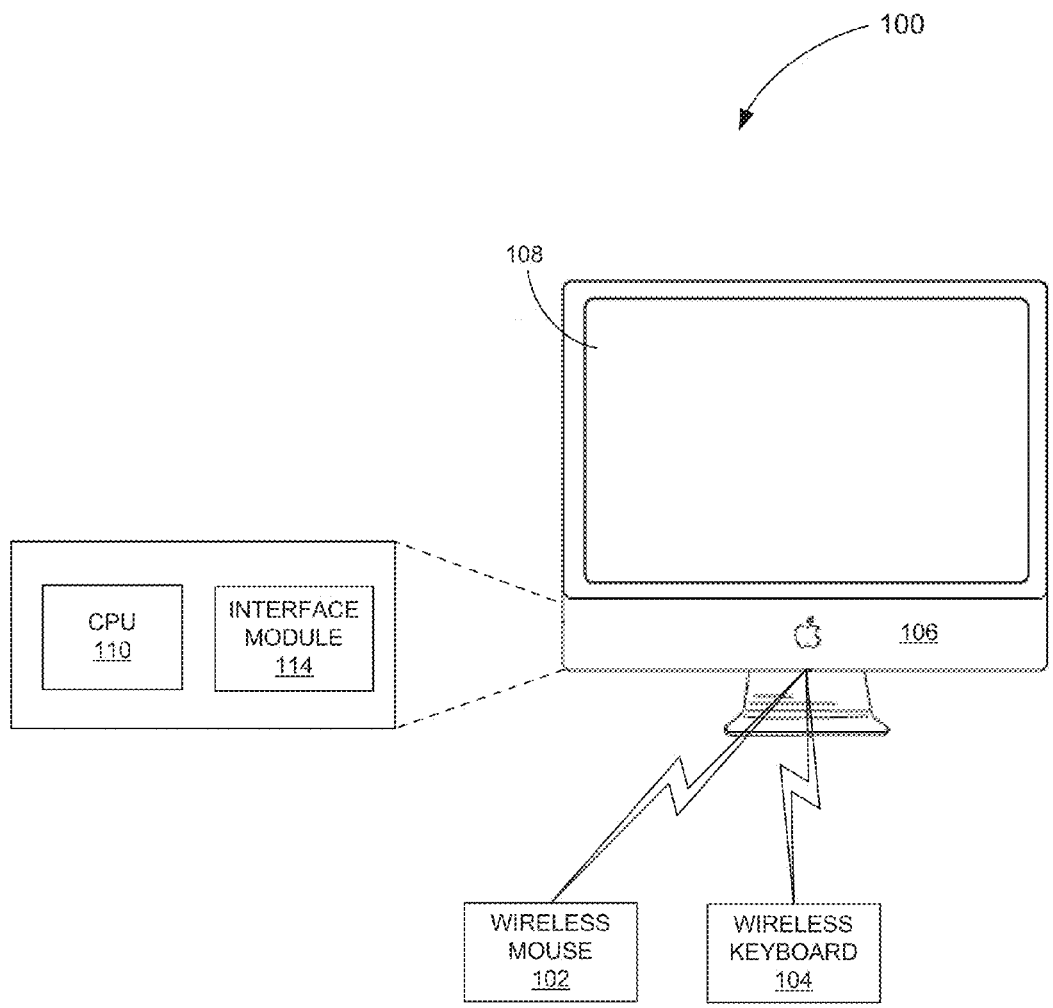
FIG. 1 depicts a processing system which includes example embodiments of human input devices in the form of a wireless mouse and a wireless keyboard in communication with a computer system.

Referring now to FIG. 1, therein is depicted a computer system 100, which includes a human input device in the form of a wireless computer mouse 102 as one example of many possible configurations that may be used to implement the present invention. The system 100 also includes a further example embodiment of a human input device in the form of a wireless keyboard 104. The mouse 102 and the keyboard 104 are each in communication with a processing system, in this example a desktop computer 106 having a display device, in the form of a computer including a display 108, integral therewith. The computer 106 includes, in conventional fashion, a central processing unit (CPU) 110, and an interface module 114, such as a Bluetooth module, for bi-directional wireless communication with the mouse 102 and the keyboard 104. The mouse 102 is to receive user input regarding cursor control by sliding movement of the mouse 102 on a desktop surface, as well as selection input by user activation or clicking of various "buttons" (mechanical or electrical; and visible or invisible) forming part of the mouse 102. Additionally, other input mechanisms may be present, such as a track-like surface capable of receiving gesture inputs, as is known in the art from the Magic Mouse, available from Apple Inc. The keyboard 104 is likewise to receive user input by the pressing of keys and/or buttons forming part of the keyboard 104. Although functionalities with respect to battery voltage measurement and expected battery life calculation are described further with respect to the mouse 102 only, it will be appreciated that the described system and operation is also applicable to other peripheral devices, and particularly to other input devices, and thus wireless keyboard 104 as well as other battery operated peripheral devices may be provided with similar components and/or functionalities.

Figure 2:
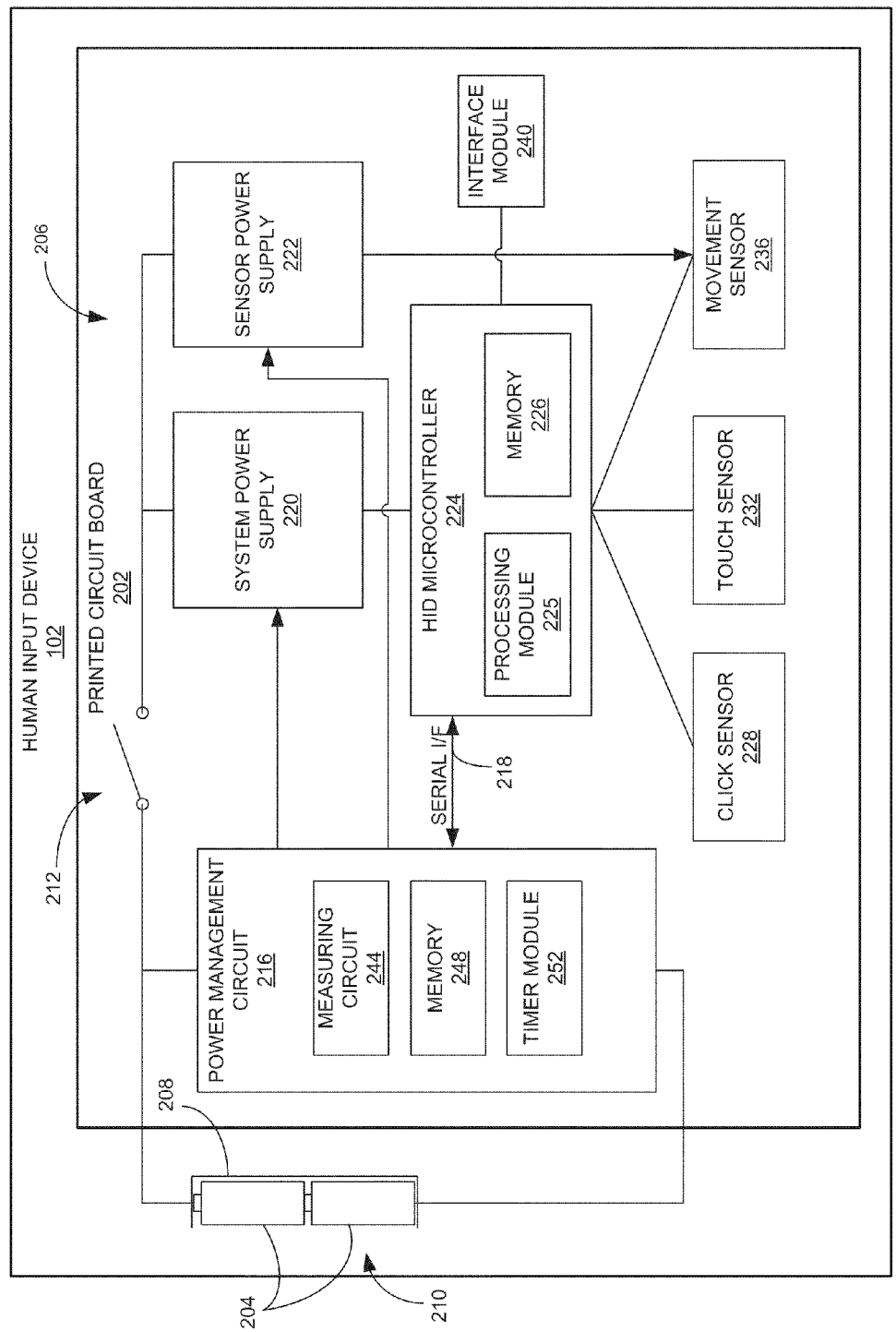
FIG. 2 depicts, in block diagram form, an example embodiment of a human input device.

FIG. 2 shows a schematic representation of one example, out of many possible constructions, for the wireless mouse 102 forming part of the example system 100. In the example of FIG. 2, all of the components are supported by or at least electrically coupled to a printed circuit board (PCB) 202.

As the mouse 102 is a wireless input device, it is not connected to an external power source, and is therefore powered by onboard batteries 204. The mouse 102 includes a battery holder 208 to receive the batteries 204 for powering circuitry on the PCB 202. The battery holder 208 is in particular configured to receive non-specific batteries 204, that is—batteries having a specific shape (such as a standardized shape), dimensions and/or voltage and current specifications, but having any one of a plurality of chemistries and other characteristics. In the example of FIG. 2, the battery holder 208 is configured for receiving two standard AA batteries, though it should be understood that the methods and apparatus herein can be used with virtually any type, configuration and capacity of battery that might be found in an input device. In this example, it will be appreciated that AA batteries are provided by a large variety of manufacturers and can have any one of a plurality of chemistries and other characteristics. The batteries may, for example, be either rechargeable or non-rechargeable. The battery holder 208 is therefore capable of receiving, by way of example only, batteries having any appropriate chemistry for the intended function, including for example, zinc-carbon, zinc-chloride, alkaline, nickel-cadmium (NiCad), nickel-metal hydride (NiMH), or lithium-ion chemistries.

As can be seen in FIG. 2, the two AA batteries 204 are positioned in series in the battery holder 208, thereby forming a compound battery 210. Although the individual batteries 204 in such an arrangement are often referred to as cells which together form a battery, the term "battery" is used herein to refer to individual modular units or cells, such as each of the AA batteries 204, while the term "compound battery" herein refers to the serial arrangement of a plurality of batteries as a unit. It is generally advisable that the respective batteries of a compound battery should have the same battery chemistry, as mixing of different battery chemistries may be detrimental to the performance and/or safety of the compound battery. Although the example embodiment described herein addresses monitoring of a compound battery comprising batteries having identical battery chemistries, the method may, in other embodiments, include separate battery evaluation—monitoring of the respective batteries of a compound battery. The method may in such case include identifying respective battery chemistries of batteries forming a compound battery, and may further comprise separately monitoring the state of charge and/or battery life of the respective batteries of such a multi-chemistry compound battery. A warning signal may be generated and/or displayed to a user in response to identification of either mixed or non-compatible battery chemistries.

The battery holder 208 forms part of a power circuit 206 which includes the circuitry on the PCB 202 and which can selectively be closed by a power switch 212. The mouse 102 includes control circuitry in the form of a human interface device (HID) microcontroller 224 to control data input functions and data transmission functions of the mouse 102. The microcontroller 224 is therefore communicatively coupled to respective sensors of the mouse 102. In this example, the mouse 102 has a click sensor 228 to receive user input in the form of button clicks on the mouse 102, a touch sensor 232 to receive user input via a touch-pad-like external surface of the mouse 102, and a movement sensor 236 to receive user input via sliding movement of the mouse 102 on a supporting surface. The movement sensor 236 may include any of a variety of sensors that may be used to sense movement, including, for example, optical movement sensors, a caged rolling ball, gyroscopic sensors, acceleration or vibration sensors, or the like. It will be appreciated that the respective sensors illustrated in FIG. 2 are not exhaustive, and that other input sensors, such as, for example, scroll balls or wheels, pressure sensors, capacitive sensors, optical sensors, etc., may be provided in other embodiments. The microcontroller 224 includes a processing module 225 to process data input signals received from the respective sensors 228, 232, and 236. The microcontroller 224 is further coupled to an interface module 240 to generate wireless radio frequency (RF) signals for reception by the computer's interface module 114.

Electrical power is supplied to the microcontroller 224 from the battery holder 208 via a system power supply 220. System power supply 220 will receive the battery voltage and current, and provide any different power that the sensors and/or circuitry may require. Depending on the power requirements of the input sensors, one or more input sensors may be provided with a separate power supply. For instance, in the example illustrated in FIG. 2, a separate sensor power supply 222 is provided to provide power to the movement sensor 236.

The mouse 102 further includes a power management circuit 216 provided on the PCB 202. The power management circuit 216 serves the dual functions of, on the one hand, controlling the supply of power to the microcontroller 224 and other circuit elements on the PCB 202, and, on the other hand, repeatedly making and temporarily storing measurements indicative of a charge level of the batteries 204. The power management circuit 216 is, in this example, a microcontroller, but in other examples the same functionalities can be provided by means of one or more application-specific integrated circuits (ASICs), digital signal processors, etc. In some examples, the power monitoring functionality might be implemented by the mouse system controller, here HID microcontroller 224. More commonly however, it will be preferable to implement that functionality separately, as in the present example, to perform the limited processing necessary through use of a device with relatively minimal power requirements.

The power management circuit 216 is configured to control power supply 220 such that the power circuit 206 is operable in an active condition, in which power is supplied from the batteries 204 to the microcontroller 224 via the system power supply 220, and a relatively inactive condition, in which the system power supply 220 does not provide power to (at least) the microcontroller 224. Thus, the power management circuit oversees, and potentially controls, all power usage in the mouse, and can control whether power is applied to any of the internal components in response to inputs to the mouse. It will be appreciated that in the active condition, the power switch 212 will be closed. The relatively inactive condition may, however, include, on the one hand, an "off" condition in which the power switch 212 is open and no power is therefore supplied to either the system power supply 220 or the sensor power supply 222, and on the other hand, an "idle" or "quiescent" condition in which the power switch 212 is closed, but no current or only a quiescent current is drawn (or allowed to be drawn) by the one or more power supplies 220, 222. The mouse 102 will typically be in such a quiescent condition when the mouse 102 is switched on, so that the mouse 102 is ready to receive user input, but no input is actually being provided by a user.

The power management circuit 216 includes a measuring circuit 244 in the form of an analog to digital converter (ADC) to measure the charge of the batteries 204, and in particular to make voltage measurements of the batteries. The power management circuit 216 further includes a timer module 252 to generate a time signal and to provide time values in the form of timestamps associated with respective battery charge measurements made by the measuring circuit 244. The timer module 252 may comprise an oscillator and a counter. The counter may show the number of elapsed ticks since battery insertion, as a time measure. A memory 248 is further provided as part of the power management circuit 216 to store respective voltage measurements and associated timestamps. In the example of FIG. 2, the memory 248 includes a set of registers for storing respective measurements and timestamps; in the described example having the capacity to store up to 1024 sets of compressed data in a FIFO arrangement.

The power management circuit 216 is configured repeatedly to take voltage measurements of the batteries 204, in particular to take measurements periodically at a first, relatively very low, frequency, for example less than one an hour, and potentially less than once a day. In the example of FIG. 2, voltage measurements are made once per hour. In other embodiments, the power management circuit 216 may be configured to take voltage measurements at a second, higher, but still relatively low frequency, such as, for example, within a range from once every 10 seconds to once per hour. As a result of the frequency of measurements and the relatively low power requirements of the measurement circuitry, the power management circuit 216 has low average power consumption.

In the example illustrated in FIG. 2, the power management circuit 216 is connected directly to the battery holder 208 and is arranged to measure battery voltage both when the power circuit 206 is in its active condition and when it is in an inactive condition. As can be seen in FIG. 2, opening of the power switch 212 does not isolate the power management circuit 216 from the batteries 204, so that the power management circuit 216 is provided with electrical power from the batteries 204 for taking repeated low frequency, or very low frequency, battery voltage measurements, even when the power switch 212 is open and the mouse 102 is in the "off" condition. Voltage measurements of the batteries 204 are thus taken even when the power switch 212 is open (i.e. when the mouse 102 is in the "off" condition), or when the power switch is closed (i.e., the mouse in powered) but the batteries 204 provide only a quiescent current (e.g. when the mouse 102 is an idle or quiescent condition).

To this end, the power management circuit 216 is configured to automatically switch off all of its components with the exception of the timer module 252 between successive measurements while the power circuit 206 is not in an active condition, thus entering a dormant state, and to automatically power up the measuring circuit 244 to take measurements in the "off" condition. In the current example, the power management circuit 216 draws a current of about 1 µA when in its dormant state, and draws a current of about 1 mA during active measurement. When the microcontroller 224 is powered by the power circuit 206, but the power management circuit 216 is not actively measuring battery charge, the power management circuit 216 draws about 100 µA. The operation of the power management circuit 216 while the power circuit 206 is in its off condition is described below in further detail with reference to FIG. 4.

In other embodiments, the power switch 212 may be located in-line between the batteries 204 in the power management circuit 216, so that the power management circuit 216 is electrically isolated from the batteries 204 when the power switch 212 is open and the power circuit 206 is in the "off" condition. In such embodiments, the power management circuit 216 will not be able to make a repeated battery charge measurements while the power circuit 206 is in the "off" condition, but will repeatedly measure battery charge when the power circuit 206 the active condition, and also when the power circuit is in the idle or quiescent condition.

The microcontroller 224 and the power management circuit 216 are connected by a serial interface 218 for transmission of voltage measurement data from the memory 248 of the power management circuit 216 to the microcontroller 224. The microcontroller 224 includes a memory 226 for storing respective voltage measurements and associated timestamps. The processing module 225 of the microcontroller 224 is configured to construct a usage model for the mouse 102 and based on voltage measurement data stored in the memory 226, and to calculate an expected battery life based at least in part on the usage model. The calculated expected battery life may be, for example, an expected remaining runtime of the batteries 204 or a percentage of the battery life consumed or remaining. Construction of the usage model is based on monitoring user behavior with respect to on/off cycling, idle states, time spent in the active condition (and periods and patterns in any of a plurality of possible states within the active condition). Thus, systems such as that of FIG. 2 enable the specific tailoring of the battery life determination to the specific usage patterns of an individual user or group of users.

Construction of the usage model may also include determining the battery chemistry of the batteries 204 based on the voltage measurements and associated timestamps stored in the memory 226. The rate of change of battery voltage (dV/dt) can be determined with reference to a series of voltage measurements in the memory 226, as each measurement is associated with a time value or timestamp. The processing module 225 is configured to determine the battery chemistry based on behavior of a voltage curve of the batteries 204 over time, as is described in greater detail with reference to FIG. 3 below.

In other embodiments, processing of a series of battery voltage measurements and associated timestamps to construct a usage model and to calculate an expected battery life may be performed not by the microcontroller 224, but by a processor, such as the CPU 110, forming part of the host computer 106. The computer 106 may therefore include a machine-readable memory in which is stored a set of computer readable instructions for performing the operations of constructing the usage model, determining battery chemistry, and calculating expected battery life, when the set of instructions is executed on the CPU 110. In such an arrangement, the series of battery charge measurements and associated time values may be transmitted wirelessly from the mouse 102 to the computer 106. Those measurements can either be sent periodically, or in response to a query from the host system.

Figure 3:
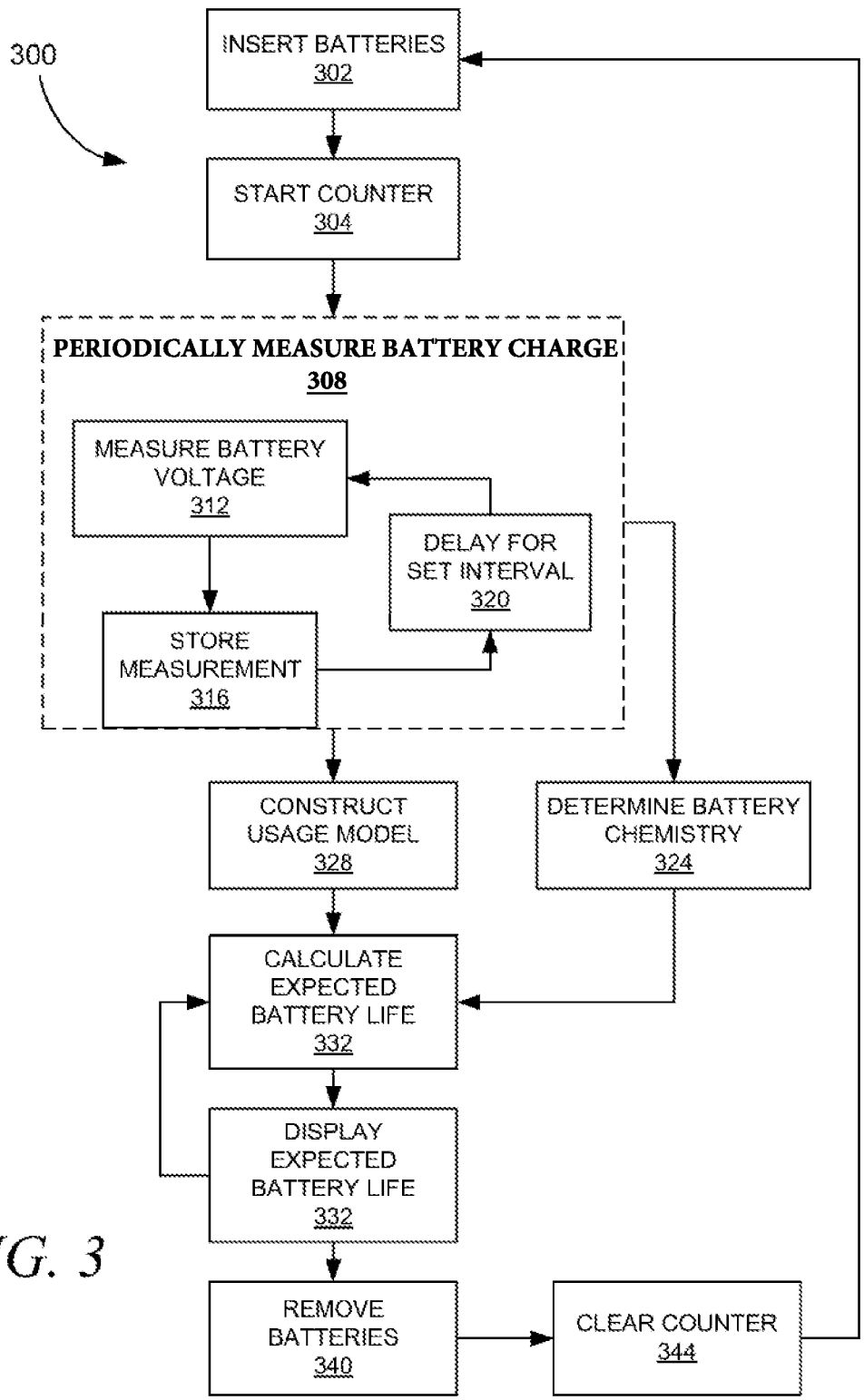
FIG. 3 depicts a flow chart showing an example method of operation of a human input device such as that depicted in FIG. 2.

Referring now to FIG. 3, the figure depicts a flow chart 300 identifying a method of operation of a human input device such as the mouse 102. When batteries 204 are inserted at 302 into the battery holder 208, the counter of the timer module 252 is started. It will be appreciated that the insertion of batteries at 302 may be the insertion of new batteries 204 or newly-recharged batteries, or may be the reinsertion of batteries 204 which were previously held by the holder 208, but which were previously removed from the battery holder 208.

Thereafter, the power management circuit 216 periodically measures the state of charge of the batteries 204 at 308. The periodic measurement at 308 is preferably performed both during reception by the mouse 102 of user input, i.e. in its active condition, and during periods when the mouse 102 is switched off or is in an idle or quiescent condition. Such periodic measurement comprises measuring battery voltage at 312 by use of the measuring circuit 244, storing the results of the measurement together with a timestamp at 316, and delaying for a set interval at 320 before taking a subsequent battery voltage measurement at 312. This cycle is performed continuously, regardless of whether or not the power circuit 206 is in an off condition or in an active condition. The measurement of the battery voltage will, in many examples, include the placing of a load across the battery. In some examples, this load may be the draw of the measuring circuit 244 itself; while in other examples, an additional (preferably known) load will be applied across the battery. In some examples, such a load may only be applied to measurements when the power circuit is in either an "off" or idle state. Differences between operation of the power management circuit 216 while the power circuit 206 is in its off condition and when it is in its active condition will be described in further detail below with reference to FIG. 4. The result of periodic measurement of battery voltage at 308 is the generation of a series of battery voltage measurements with associated timestamps, stored in memory 226 of the microcontroller 224.

In some embodiments, the frequency of battery charge measurement by the power management circuit 216 may be variable, for example being automatically variable responsive to changes in the operating condition of the mouse 102. Measuring frequency may, for example, be increased during an initial phase of a recovery period, in order more closely to track a rate of change in battery voltage; or immediately after battery insertion, to enable rapid identification of the battery type. Measuring frequency may also automatically decrease incrementally during an extended period of input inactivity.

Figure 4:
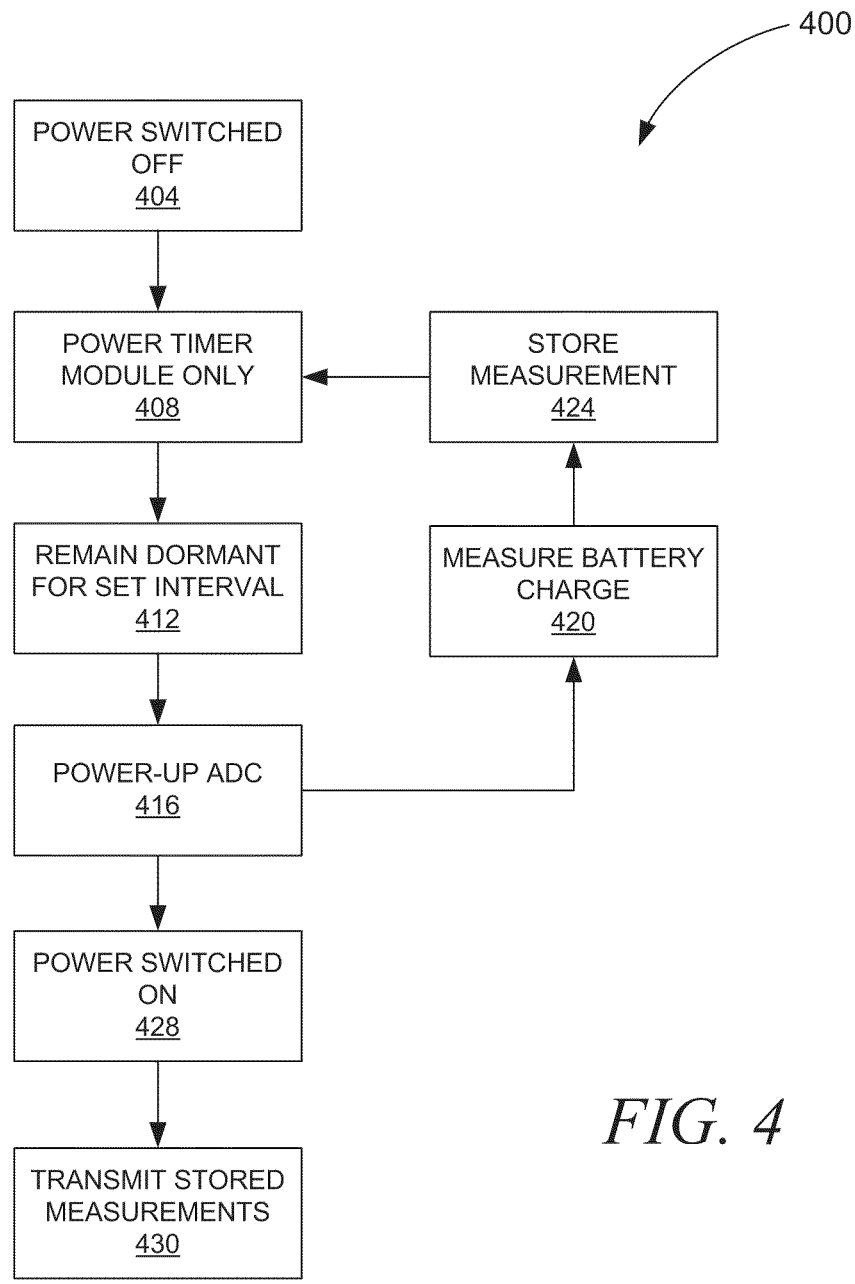
FIG. 4 depict a flow chart showing example method of operation of a power supervisory circuit forming part of a human input device such as that depicted in FIG. 2.

Referring now to FIG. 4, reference numeral 400 generally indicates a method performed by the measuring circuit 244 for repeatedly taking measurements of the state of charge of the batteries 204 while the power circuit 206 is in an "off" condition. In response to opening of the power switch 212 at 404, the power management circuit 216 automatically reverts at 408 to a dormant mode, in which only the timer module 252 is powered. The ADC of the measuring circuit 244 is therefore switched off and draws no current. After remaining dormant at 412 for a set interval, the power management circuit 216 automatically powers up at 416 the measuring circuit 244 and other components of the power management circuit 216 required for making and storing battery voltage measurements.

Battery voltage is then measured at 420 and the measured value is stored, at 424, together with a timestamp in the memory 248 of the power management circuit 216. Thereafter, the power management circuit reverts to its dormant mode at 408, powering only the timer module 252. The above-described cycle is repeated until the power switch 212 is switched on, at 428. In response to closing of the power switch 212 at 428, data stored temporarily in the memory 248 of the power management circuit 216 is transmitted at 430 to the microcontroller 224 via the serial interface 218 for storage in the memory 226 of the microcontroller 224.

Returning again to FIG. 3, the method 300 further comprises determining battery chemistry at 324 based on the periodic voltage measurements taken at 308. In particular, the microcontroller 224 may determine the battery chemistry based on behavior of a measured voltage curve during, for example, a recovery period. Such a recovery period is a period immediately following the removal of a load on the battery. Thus, during use of the mouse 102 for data input, power is drawn from the batteries 204 for driving the microcontroller 224 and the sensors 228, 234, 236, via the respective power supplies 220, 222. The measured voltage of the batteries 204 progressively diminishes during such use, but if all or a portion of the load is then removed, such as by the mouse 102 being switched off or entering a relatively quiescent state, the battery 204 recovers, gradually increasing in voltage. Batteries with different chemistries display distinct recovery behavior, and battery chemistry can thus be determined with reference to the voltage curve during the recovery period. As addressed earlier herein, a load may also be applied to assist measurements, such as recovery measurements, during a quiescent period.

Figure 5:
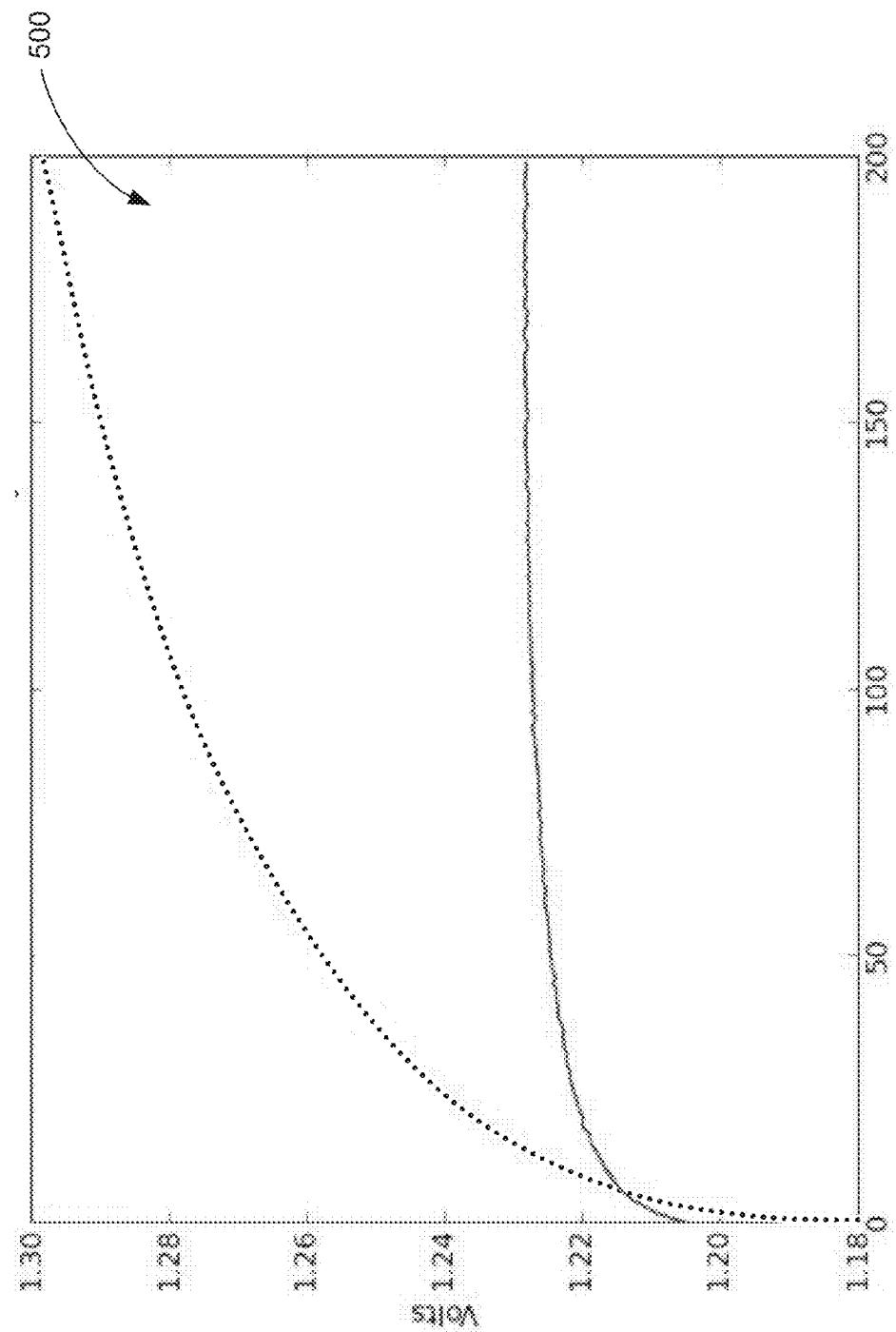
FIG. 5 depicts a graph of battery voltage curves for two example battery chemistries during a recovery period.

FIG. 5 shows a graph 500 illustrating two example voltage curves for respective battery chemistry used during a recovery period. In FIG. 5, a recovery curve for an alkaline battery is shown as a dotted line, while a recovery curve for a NiMH battery is shown as a solid line. As can be seen in FIG. 5, the NiMH battery recovers more quickly towards a maximum voltage at which it plateaus, while the alkaline battery recovers more gradually, but regains a higher voltage level. The example graph 500 is with respect to curves determined by taking four voltage measurements per minute. These recovery curves can be considered signatures for distinguishing between battery chemistries. In the example of FIG. 5, it may be possible to distinguish between the two illustrated battery chemistries by analyzing the slope of the curve at a particular time subsequent to start of the recovery period. Thus, for example, if dV/dt for the respective curves is assessed at 50 minutes after the start of the recovery period, the value for an alkaline battery will be greater than that of a NiMH battery. In other embodiments, battery chemistry may be determined by analyzing a rate of change of the voltage curve slope.

The processing module 225 of the microcontroller 224 is programmed or otherwise configured to distinguish between respective battery chemistries. For example, the processing module 225 may calculate, based on the series of voltage measurements and timestamps stored in the memory 226, the slope (dV/dt) of a measured voltage curve for the batteries 204 at one or more times during a recovery period. These calculated slope values may be compared to pre-stored guideline values in order to determine the battery chemistry of the particular batteries 204 in the battery holder 208. As discussed above, in other embodiments, the determination of battery chemistry may be performed by a processor separate from the wireless mouse 102, for example being performed by the CPU 110 of the computer 106. In such cases, the mouse 102 will transmit to the computer 106 a series of battery measurements and associated timestamps, instead of itself processing the measurements and timestamps to determine the battery chemistry.

Although not illustrated in the method 300 of FIG. 3, in some examples, periodic measurements may be temporarily terminated after a predetermined time interval during the recovery period, if there is no further device activity. Thus, if the mouse 102 is switched off battery voltage may be periodically measured for the predetermined time interval, e.g. for 4 hours, 1 day, or 2 days, after which periodic battery voltage measurement is stopped until the mouse 102 is again activated.

The method 300 also comprises constructing a usage model at 328 for the mouse 102. The usage model is constructed based on the series of measurements taken at 308 and is continuously updated and refined. By analyzing the measured voltage level of the batteries 204 over time, the processing module 225 identifies user habits or patterns with respect to the mouse 102, for example identifying the amount of time that the mouse 102 is used in respective conditions or states, average time intervals between successive uses of the mouse 102 for data input, and so forth. It will be appreciated that battery life is influenced by user behavior. For example, in some input device configurations, batteries in an input device which is used for an average of 15 hours a day and where the input device is not switched off between periods of use may have a shorter life than batteries in an input device which is used for an average of six hours a day and which is switched off between periods of use. The usage model constructed by the processing module 225 based on the series of voltage measurements serves to factor such differences in user behavior with respect to the mouse 102 into calculation of expected battery life. The usage model may include information about total run time from battery insertion to reaching a "low battery" threshold, and total time spent in different power or use states. The usage model will, in many examples, be retained such as in non-volatile memory, within the input device. In these examples, the usage model can be refined over time. In using past usage models to refine the current usage model, different weights may be applied to prior measurements. For example, older usage models or use measurements might be given less weight than a usage model or set of measurements from an immediately preceding time period.

Figure 6:
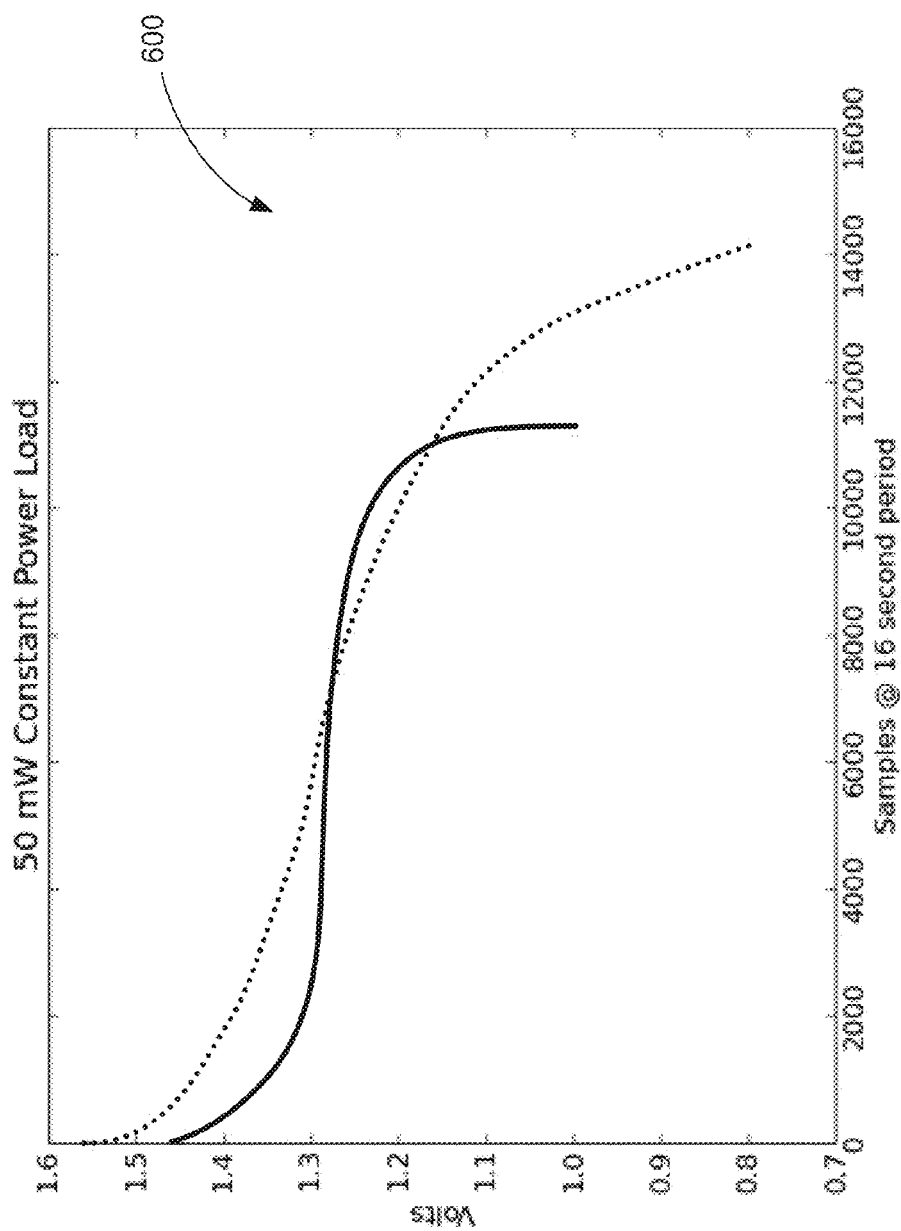
FIG. 6 depicts a graph of a battery voltage curve for an example battery chemistry during discharge.

The expected battery life of the batteries 204 is calculated at 332 based on the constructed usage model, determined battery chemistry, and recent voltage measurements taken at 308. It will be appreciated that batteries with different chemistries display not only different recovery curves, as described with reference to FIG. 5, but also have different discharge curves. FIG. 6 shows a graph 600 which illustrates a example discharge curves for a NiMH (shown as a solid line in FIG. 6) battery and an alkaline battery (shown as a dotted line in FIG. 6). The curves of FIG. 6 were obtained by exposing respective batteries to a constant 50 mW load and taking battery charge measurements once every 16 seconds. It will be noted that the slope (dV/dt) of the discharge curve is relatively low in a middle period, but has relatively high negative values during an initial period and during a final period. The processing module 225 may identify when a NiMH battery 204 is critically low by establishing that the voltage slope has a relatively high negative value while the battery voltage is relatively low. The microcontroller 224 can therefore be provided with predefined voltage values, voltage slope (dV/dt) values, and combinations thereof, for respective battery chemistries, to identify critically low battery charge states. The processing module 225 may keep track of the measured voltage of the batteries 204, the measured voltage slope, and change in the voltage slope to determine the state of charge of the batteries 204 and to calculate the expected battery life.

In the present example, the result of battery life calculations is transmitted to the computer 106 via the respective interface modules 114, 240 and an indication of expected battery life is displayed at 336 on the computer screen 108. The indication of expected battery life which is displayed on the computer screen 108 may be in the form of a battery gauge which shows a level of charge of the batteries 204. In other examples, the indication may be a display of remaining runtime of the batteries 204. In yet another example, the indication of expected battery life may be limited to, or may include, a warning when the battery approaches an end of its life. As used herein, the end of a battery's life means that the battery has insufficient charge to provide a minimum current required by the circuitry of the mouse 102, even if the battery is a rechargeable battery that may be replaced after having been recharged.

When the batteries 204 are removed at 340 the counter of the timer module 252 is reset and the memory 226 of data specific to the prior batteries is cleared 344, although, as noted previously herein, all or at least a portion of prior usage models, or pertinent measurements underlying those models, may desirably be retained. The method 300 is repeated when new batteries are inserted at 302. In certain embodiments, a user may have the option of providing recorded information regarding battery life and performance to a device provider, in order to optimize future battery life calculations.

Figure 7:
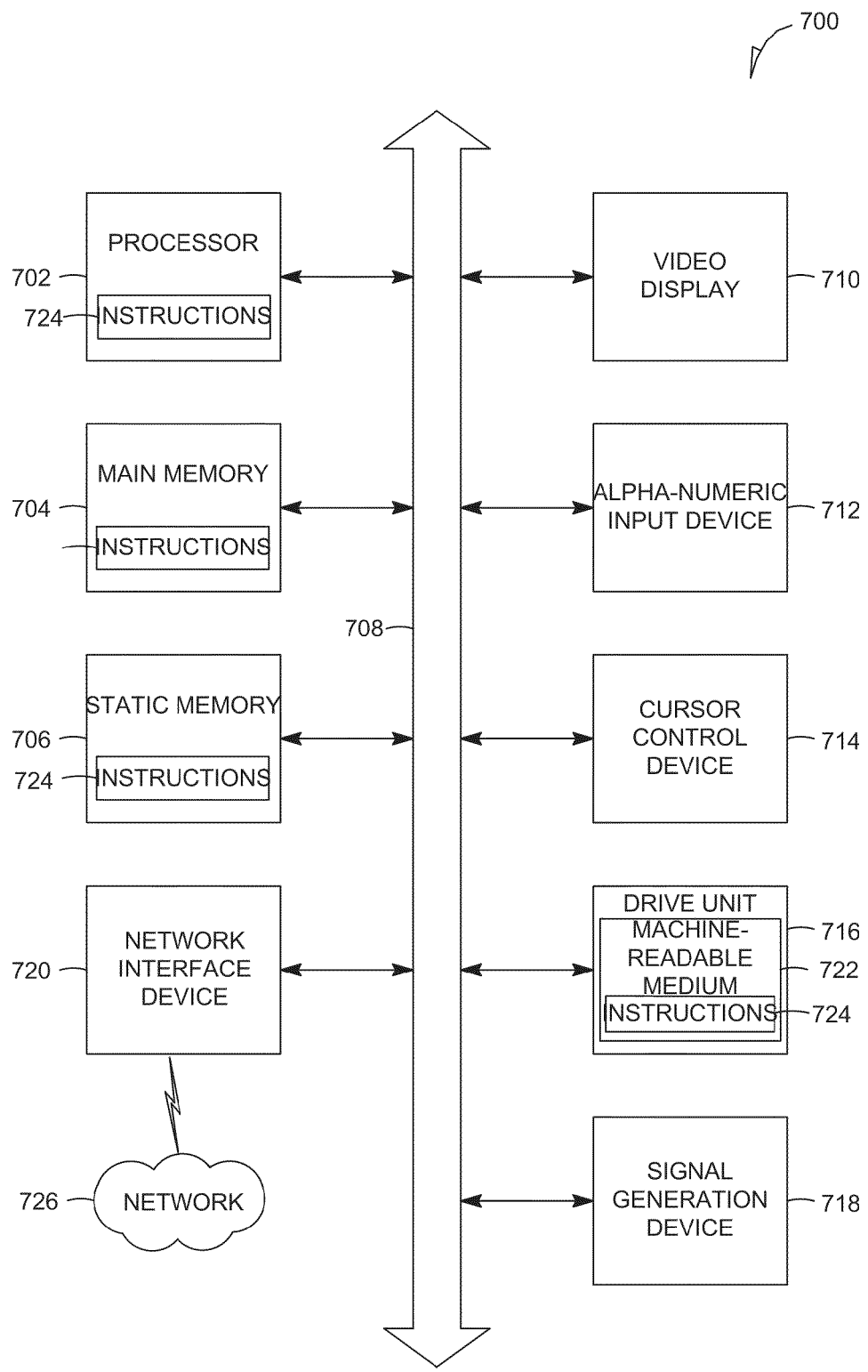
FIG. 7 is a block diagram of a machine in the example form of a computer system within which a set of instructions may be executed for causing the machine to perform any one or more of the methodologies discussed herein.

FIG. 7 shows a diagrammatic representation of a machine in the example form of a computer system 700 within which a set of instructions, for causing the machine to perform any one or more of the methodologies discussed herein, may be executed. The set of instructions may, for example, be to process a series of battery charge measurements and associated time values taken by measuring arrangement on a human input device, to determine a battery chemistry based on the series of battery charge measurements and time values, to construct a usage model for the human input device, and to calculate an expected or projected battery life based at least in part on the usage model and the series of battery charge measurements.

In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a server computer, a client computer, a personal computer, a tablet, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 700 includes a processor 702 (e.g., a central processing unit (CPU) a graphics processing unit (GPU) or both), a main memory 704 and a static memory 706, which communicate with each other via a bus 708. The computer system 700 may further include a video display unit 710 (e.g., a liquid crystal display (LCD) or a cathode ray tube (CRT)). The computer system 700 also includes an alphanumeric input device 712 (e.g., a keyboard), a cursor control device 714 (e.g., a mouse), a disk drive unit 716, a signal generation device 718 (e.g., a speaker) and a network interface device 720.

The disk drive unit 716 includes a machine-readable medium 722 on which is stored one or more sets of instructions (e.g., software 724) embodying any one or more of the methodologies or functions described herein. The software 724 may also reside, completely or at least partially, within the main memory 704 and/or within the processor 702 during execution thereof by the computer system 700, the main memory 704 and the processor 702 also constituting machine-readable media.

The software 724 may further be transmitted or received over a network 726 via the network interface device 720.

While the machine-readable medium 722 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" or "computer-readable medium" shall be taken to include any tangible non-transitory medium which is capable of storing or encoding a sequence of instructions for execution by the machine and that cause the machine to perform any one of the methodologies.

Many additional modifications and variations may be made in the techniques and structures described and illustrated herein without departing from the spirit and the scope of the present invention. For example, FIG. 2 discusses an input device having an onboard processor for processing data resulting from battery voltage measurement. Many variations may be made in the allocation of processing responsibilities. For example, it is possible to avoid any substantial processing of data within the input device. In such an embodiment, battery voltage measurements and associated time values may be processed to the minimal extent required for further communication and/or digitizing, then digitized and communicated across the wireless interface for further processing by one or more processors within the computer or other processing system to which the interface device is coupled. Accordingly, the present invention should be clearly understood to be limited only by the scope of the claims and equivalents thereof.

What is claimed is:

1. A method for monitoring battery life in a battery-powered input device for a processing system, the method comprising:
   sending a wireless signal to the battery-powered input device, wherein the wireless signal corresponds to a request for a plurality of battery charge measurements;
   causing the battery-powered input device to perform a plurality of charge measurements to derive the plurality of battery charge measurements and a plurality of time stamps each corresponding to a battery charge measurement of the plurality of battery charge measurements;
   receiving the plurality of battery charge measurements and the plurality of time stamps from the battery-powered input device;
   constructing a usage model based on the plurality of battery charge measurements and the plurality of time stamps, wherein constructing the usage model includes determining time intervals between successive uses of the battery-powered input device; and
   calculating an expected battery life based on the usage model.

2. The method of claim 1, wherein the battery-powered input device has operating states comprising:
   an active condition in which one or more batteries of the battery-powered input device provide electric power to control circuitry, which controls operational functions of the battery-powered input device; and
   a second condition in which the control circuitry is not powered by the one or more batteries; and
   wherein a repeated measuring of a charge of the one or more batteries is performed both while the battery-powered input device is in the active condition and while the battery-powered input device is in the second condition.

3. The method of claim 1, wherein performing the plurality of battery charge measurements comprises periodically measuring a charge of one or more batteries at a low-frequency.

4. The method of claim 3, wherein performing a plurality of charge measurements comprises:
   switching off at least a measuring circuit between successive battery charge measurements, and periodically powering up the measuring circuit to measure battery charge.

5. The method of claim 1, the method further comprising maintaining and updating the usage model until one or more batteries are physically removed from the battery-powered input device, and initiating construction of a new usage model following reception of one or more replacement batteries in the battery-powered input device.

6. The method of claim 1, wherein performing the plurality of charge measurements comprises repeatedly measuring a charge of a compound battery formed by two or more batteries received by the battery-powered input device.

7. The method of claim 1, wherein the time intervals are defined by the plurality of time stamps.

8. The method of claim 1, wherein constructing the usage model includes determining a time interval between a battery insertion time and a time when battery charge reaches a low battery threshold.

9. A wireless input device, comprising:
   one or more replaceable batteries;
   a measuring circuit configured to perform a plurality of charge measurements of the one or more replaceable batteries to derive a plurality of battery charge measurements;
   a processing module;
   and a memory storing instructions that when executed by the processing module cause the processing module to perform the steps of:
      constructing a usage model based on the plurality of battery charge measurements and a plurality of time stamps each corresponding to each battery charge measurement of the plurality of batter charge measurements, wherein the usage model is based on data corresponding to time intervals between successive uses of the wireless input device, and
      calculating an expected batter life value based upon the usage mode; and
   an interface module configured to transmit the expected battery life value to a host device via a wireless signal.

10. The wireless input device of claim 9, wherein the time intervals are defined by the plurality of time stamps.

11. The wireless input device of claim 9, wherein the measuring circuit is configured to initiate construction of the usage model following first reception of one or more batteries in the wireless input device, to refine the usage model until the one or more batteries are physically removed from the wireless input device, and to initiate construction of a new usage model upon reception of one or more replacement batteries.

12. The wireless input device of claim 9, further comprising two or more batteries, wherein the measuring circuit is configured to take repeated battery charge measurements of a compound battery comprising the two or more batteries.

13. The wireless input device of claim 12, wherein the processing module is further configured to determine respective battery chemistries of the two or more batteries, and to construct the usage model based on the respective determined battery chemistries.

14. The wireless input device of claim 9, wherein the measuring circuit is configured to make the plurality of charge measurements periodically according to a predetermined frequency.

15. The wireless input device of claim 9, wherein the measuring circuit includes a controller to switch off at least the measuring circuit between successive battery charge measurements, and periodically power up the measuring circuit to subsequently measure battery charge.

16. A computer system, comprising:
  a processor;
  a display;
  a remote input device, comprising:
    one or more replaceable batteries,
    a measuring circuit configured to perform a plurality of charge measurements of one or more batteries, and
    an interface module configured to transmit battery charge measurements to the processor; and
  a memory storing instructions that when executed by the processor cause the computer system to:
    receive, from the remote input device, the battery charge measurements,
    constructing a usage model based on the battery charge measurements and time stamps associated with the battery charge measurements, wherein constructing the usage model includes determining time intervals between successive uses of the remote input device, and
    calculate an expected battery life based upon the usage model.

17. The computer system of claim 16, wherein the instructions further include a step of generating on the display a visual indication of the expected battery life.

18. The computer system of claim 16, wherein the interface module is configured to periodically transmit new battery charge measurements.

19. A non-transitory computer-readable storage medium storing instructions that when executed by a processor in a computing device, cause the computing device to perform the steps of:
  sending a wireless signal to a remote input device, wherein the wireless signal corresponds to a request for a plurality of battery charge measurements;
  causing the remote input device to perform a plurality of charge measurements to derive the plurality of battery charge measurements;
  receiving the plurality of battery charge measurements from the remote input device;
  constructing a usage model based on the plurality of battery charge measurements and a plurality of time stamps associated with the plurality of batter charge measurements, wherein constructing the usage model includes determining time intervals between successive uses of the remote input device;
  and
  calculating an expected battery life based on the usage model.

20. The non-transitory computer-readable storage medium of claim 19, wherein the time intervals are defined by the plurality of time stamps.

21. The non-transitory computer-readable storage medium of claim 20, wherein performing the plurality of charge measurements comprises switching off at least a measuring circuit between successive battery charge measurements, and periodically powering up the measuring circuit to measure battery charge.

22. The non-transitory computer-readable storage medium of claim 19, further comprising the steps of maintaining and updating the usage model until one or more batteries are physically removed from the remote input device, and initiating construction of a new usage model following reception of one or more replacement batteries in the remote input device.

23. The non-transitory computer-readable storage medium of claim 19, wherein performing the plurality of charge measurements comprises repeatedly measuring a charge of a compound battery formed by two or more batteries received by the remote input device.

24. The non-transitory computer-readable storage medium of claim 19, further comprising the steps of determining an average interval of time between successive uses.

25. The non-transitory computer-readable storage medium of claim 19, wherein constructing the usage model includes determining a time interval between a battery insertion time and a time when a battery charge reaches a low battery threshold.

* * * * *